US012035585B2

(12) United States Patent
Yoon et al.

(10) Patent No.: US 12,035,585 B2
(45) Date of Patent: Jul. 9, 2024

(54) DISPLAY DEVICE

(71) Applicant: Samsung Display Co., Ltd., Yongin-Si (KR)

(72) Inventors: Juwon Yoon, Yongin-si (KR); Sanghee Jang, Yongin-si (KR); Kibum Kim, Yongin-si (KR); Taehoon Yang, Yongin-si (KR); Jeonghyun Lee, Yongin-si (KR); Jongchan Lee, Yongin-si (KR); Pilsuk Lee, Yongin-si (KR); Woonghee Jeong, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 512 days.

(21) Appl. No.: 17/298,616

(22) PCT Filed: May 8, 2019

(86) PCT No.: PCT/KR2019/005490
§ 371 (c)(1),
(2) Date: May 31, 2021

(87) PCT Pub. No.: WO2020/122332
PCT Pub. Date: Jun. 18, 2020

(65) Prior Publication Data
US 2022/0028955 A1    Jan. 27, 2022

(30) Foreign Application Priority Data

Dec. 14, 2018  (KR) .................... 10-2018-0162146

(51) Int. Cl.
*H10K 59/131*    (2023.01)
(52) U.S. Cl.
CPC ............................... *H10K 59/131* (2023.02)

(58) Field of Classification Search
CPC ................. H10K 59/124; H10K 59/131–1315
See application file for complete search history.

(56) References Cited

U.S. PATENT DOCUMENTS 7,382,342 B2    6/2008 Uchino et al.
7,605,599 B2   10/2009 Kwak et al.
(Continued)

FOREIGN PATENT DOCUMENTS

| CN | 104752483 A | 7/2015 |
| CN | 108091634 A | 5/2018 |

(Continued)

OTHER PUBLICATIONS

Extended European Search Report corresponding to Application No. 19895559.3 dated Sep. 2, 2022, 9 pages.

(Continued)

*Primary Examiner* — Daniel P Shook
(74) *Attorney, Agent, or Firm* — Innovation Counsel LLP

(57) ABSTRACT

An embodiment of the present disclosure comprises a display device including a substrate including a display area and a peripheral area around the display area, a thin-film transistor on the substrate in the display area and a display element electrically connected to the thin-film transistor, and a first voltage line and a second voltage line located on the substrate in the peripheral area and supplying power for driving the display element, wherein the first voltage line is a common voltage line and entirely surrounds the display area, the second voltage line is a driving voltage line and is arranged to correspond to one side of the display area, and the first voltage line and the second voltage line are on different layers.

20 Claims, 9 Drawing Sheets

(56) References Cited

U.S. PATENT DOCUMENTS

| | | | |
|---|---|---|---|
| 7,884,786 | B2 | 2/2011 | Kim et al. |
| 8,896,587 | B2 | 11/2014 | Nakamura |
| 9,384,687 | B2 | 7/2016 | Lee et al. |
| 9,397,150 | B2 | 7/2016 | Kim et al. |
| 9,893,093 | B2 | 2/2018 | Kim et al. |
| 10,021,741 | B2 | 7/2018 | Lee et al. |
| 10,134,829 | B2 | 11/2018 | Shin et al. |
| 10,446,793 | B2 | 10/2019 | Kim et al. |
| 2006/0267492 | A1 | 11/2006 | Oh |
| 2016/0190228 | A1* | 6/2016 | Park .................. H10K 59/1315 |
| | | | 257/40 |

FOREIGN PATENT DOCUMENTS

| | | |
|---|---|---|
| EP | 3041051 A1 | 7/2016 |
| JP | 2004-361585 A | 12/2004 |
| JP | 2007-157470 A | 6/2007 |
| JP | 4887027 B2 | 2/2012 |
| JP | 2012-226360 A | 11/2012 |
| KR | 10-0604054 B1 | 7/2006 |
| KR | 10-2014-0081669 A | 7/2014 |
| KR | 10-2015-0075633 A | 7/2015 |
| KR | 10-2016-0065436 A | 6/2016 |
| KR | 10-2016-0082669 A | 7/2016 |
| KR | 10-2017-0115153 A | 10/2017 |
| KR | 10-2018-0039801 A | 4/2018 |
| WO | 2015099419 A1 | 7/2015 |

OTHER PUBLICATIONS

International Search Report for International Application No. PCT/KR2019/005490 dated Sep. 11, 2019, 6 pages with English Translation for International Search Report.

\* cited by examiner

DISPLAY DEVICE

CROSS-REFERENCE TO RELATED APPLICATION

This application claims priority to and the benefit of Korean Patent Application No. 10-2018-0162146, filed on Dec. 14, 2018 and PCT Application No PCT/KR2019/005490, filed May 8, 2019, the entire contents of which are incorporated herein by reference.

BACKGROUND

1. Field

The present disclosure generally relates to a display device. More particularly, the present disclosure relates to a display device in which a high-quality image is displayed.

2. Description of Related Art

As displays for visually expressing various electrical signal information have been rapidly developed, various flat panel display devices having excellent characteristics such as being thin, small weight, and low power consumption are being researched and developed. Among them, an organic light-emitting display device, which is a self-luminous display device, does not require a separate light source, and accordingly, the organic light-emitting display device may be driven with a low voltage, may be configured to be a lightweight and thin display device, and may exhibit excellent characteristics including wide viewing angles, high contrast, and fast response speeds. Therefore, an organic light-emitting display device on the spotlight as a next-generation display device.

SUMMARY

An organic light-emitting display device includes a plurality of pixels, wherein pixels of the organic light-emitting display device operating in an analog driving method display gray scale by adjusting the brightness according to the size of an input voltage or current data, and pixels of the organic light-emitting diode display gray scale by emitting light with the same brightness but different light emission times. Meanwhile, a voltage drop (or IR Drop) may occur in a power line supplying power to the pixels due to resistance components of power lines, which may cause image quality deterioration of a display device.

Embodiments of the present disclosure provide a display device in which a high-quality image is displayed.

A display device according to the present disclosure may supply a uniform common voltage to light-emitting devices, and thus may display a high-quality image. However, the scope of the present disclosure is not limited to the effect.

A display device according to an aspect of the present disclosure includes: a substrate including a display area and a peripheral area around the display area; a thin-film transistor on the substrate in the display area and a display element electrically connected to the thin-film transistor; and a first voltage line and a second voltage line located on the substrate in the peripheral area and supplying power for driving the display device, wherein the first voltage line is a common voltage line and entirely surrounds the display area, the second voltage line is a driving voltage line and is arranged to correspond to one side of the display area, and the first voltage line and the second voltage line may be arranged on different layers.

In the present embodiment, the display element may include a pixel electrode electrically connected to the thin-film transistor, a common electrode on the pixel electrode, and an intermediate layer including an organic material between the pixel electrode and the common electrode, wherein all edges of the common electrode may be electrically connected to the first voltage line.

In the present embodiment, the common electrode and the first voltage line are connected to each other through a conductive layer, and the conductive layer may have the same configuration as the pixel electrode.

In the present embodiment, the substrate may further include a pad area located in the peripheral area, the second voltage line is located between one side of the display area and the pad area, and the first voltage line may at least partially overlap the second voltage line in a vertical direction.

In the present embodiment, the display device may further include a first insulating layer covering the thin-film transistor between the thin-film transistor and the display element, wherein the first voltage line may have the same structure as a metal wire on the first insulating layer, and the second voltage line may have the same structure as a source electrode and a drain electrode of the thin-film transistor.

In the present embodiment, the display device may further include a driving circuit unit located on the substrate in the peripheral area and transmitting an electric signal to the display area, wherein the driving circuit unit may be covered by the first insulating layer.

In the present embodiment, the display device may further include an auxiliary wire arranged under the first voltage line and electrically connected to the first voltage line.

In the present embodiment, the auxiliary wire may be on the same layer as the second voltage line and may have the same structure as the second voltage line.

In the present embodiment, the auxiliary wire and the second voltage line may be located on different layers.

In the present embodiment, the auxiliary wire may be arranged entirely along the first voltage line.

A display device according to another aspect of the present disclosure includes a substrate including a display area and a peripheral area around the display area; a pixel circuit located on the substrate in the display area and an organic light-emitting device electrically connected to the pixel circuit; a first voltage line located on the substrate in the peripheral area and applying a common voltage to the organic light-emitting device; and a driving circuit unit located on the substrate in the peripheral area and arranged between the first voltage line and the pixel circuit, and transmitting an electric signal to the display area, wherein the driving circuit unit may be covered by a first insulating layer arranged over the display area and the peripheral area, and the first voltage line may entirely surround the display area and may have the same material and the same structure as an wire on the first insulating layer of the display area.

In the present embodiment, the organic light-emitting device may include a common electrode electrically connected to the first voltage line, and all edges of the common electrode may be electrically connected to the first voltage line.

In the present embodiment, the substrate may further include a pad area in the peripheral area and a second voltage line between one side of the display area and the pad area, wherein the second voltage line may be at a different height from the first voltage line.

In the present embodiment, the first insulating layer may be between the second voltage line and the first voltage line.

In the present embodiment, the first voltage line may at least partially overlap the second voltage line in a vertical direction.

In the present embodiment, the display device may further include an auxiliary wire arranged under the first voltage line and electrically connected to the first voltage line.

In the present embodiment, the auxiliary wire may be on the same layer as the second voltage line and may have the same structure as the second voltage line.

In the present embodiment, the auxiliary wire and the second voltage line may be located on different layers.

In the present embodiment, the display device may further include a first inorganic encapsulation layer, an organic encapsulation layer, and a second inorganic encapsulation layer sequentially stacked on the organic light-emitting device, wherein the first inorganic encapsulation layer and the second inorganic encapsulation layer may contact each other outside the organic encapsulation layer.

In the present embodiment, the display device may further include a first partition located on the substrate in the peripheral area and apart from the first insulating layer, wherein the first inorganic encapsulation layer and the second inorganic encapsulation layer may extend to the outside of the first partition.

DETAILED DESCRIPTION

Figure 1:
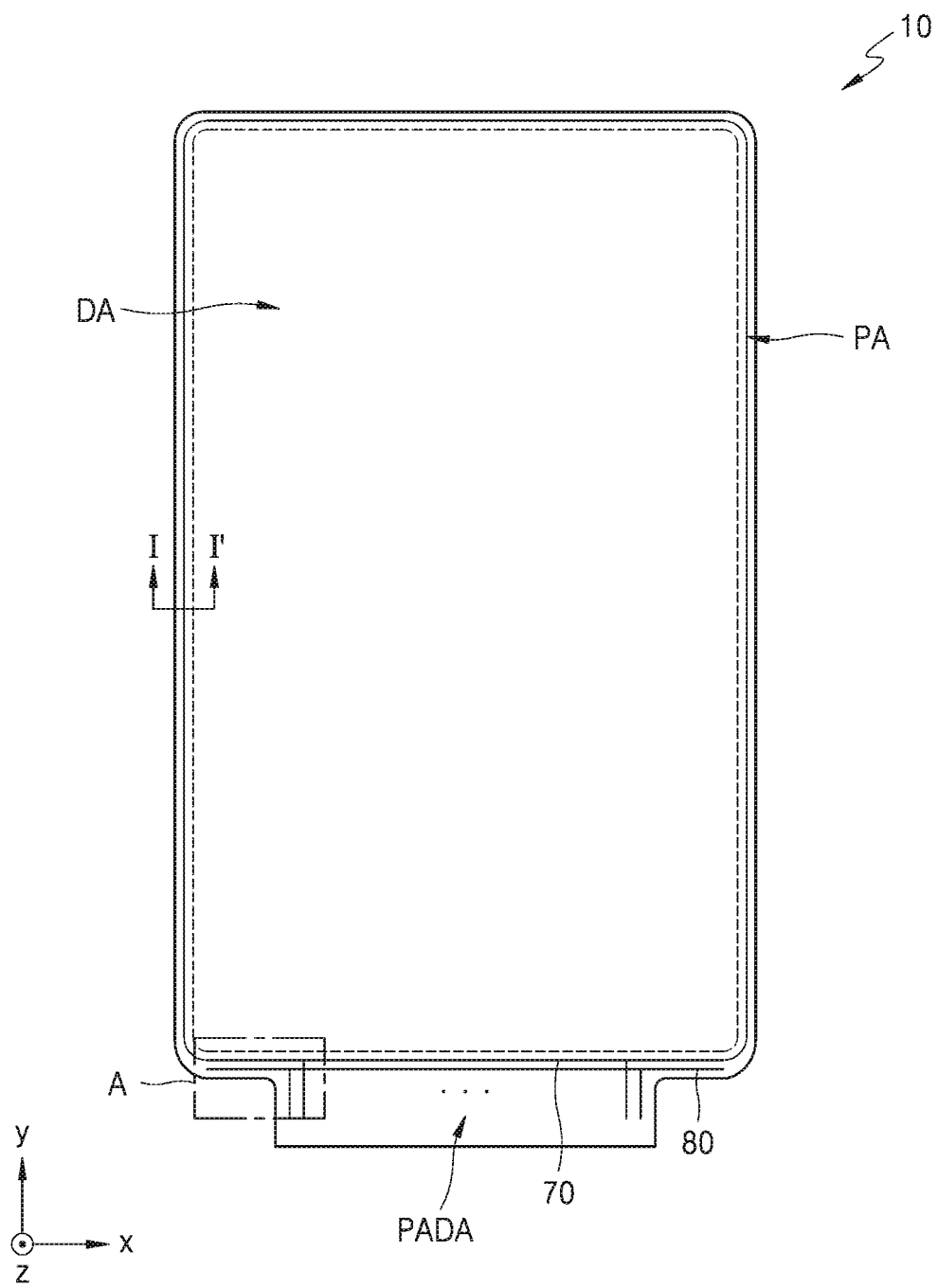
FIG. 1 is a schematic plan view of a display device according to an embodiment of the present disclosure.

Since the present disclosure may have diverse modified embodiments, preferred embodiments are illustrated in the drawings and are described in the detailed description. Advantages and features of the present disclosure, and implementation methods thereof will be clarified through following embodiments described with reference to the accompanying drawings. The present disclosure may, however, be embodied in many different forms and should not be construed as limited to the embodiments set forth herein.

It will be understood that although the terms "first," "second," etc. may be used herein to describe various elements, these elements should not be limited by these terms.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, area, or element, it can be directly or indirectly formed on the other layer, region, or element. That is, for example, intervening layers, regions, or elements may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Hereinafter, embodiments will be described in detail with reference to the accompanying drawings. The same reference numerals are used to denote the same elements.

Figure 2:
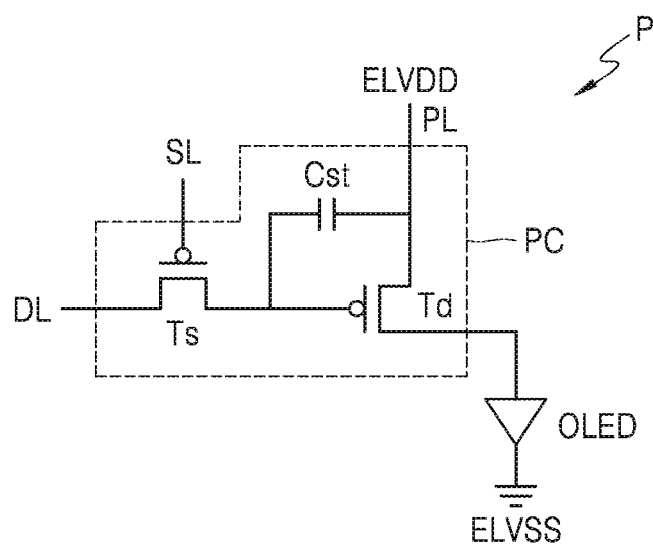
FIG. 2 is an equivalent circuit diagram of a pixel of a display device according to an embodiment of the present disclosure.
Figure 3:
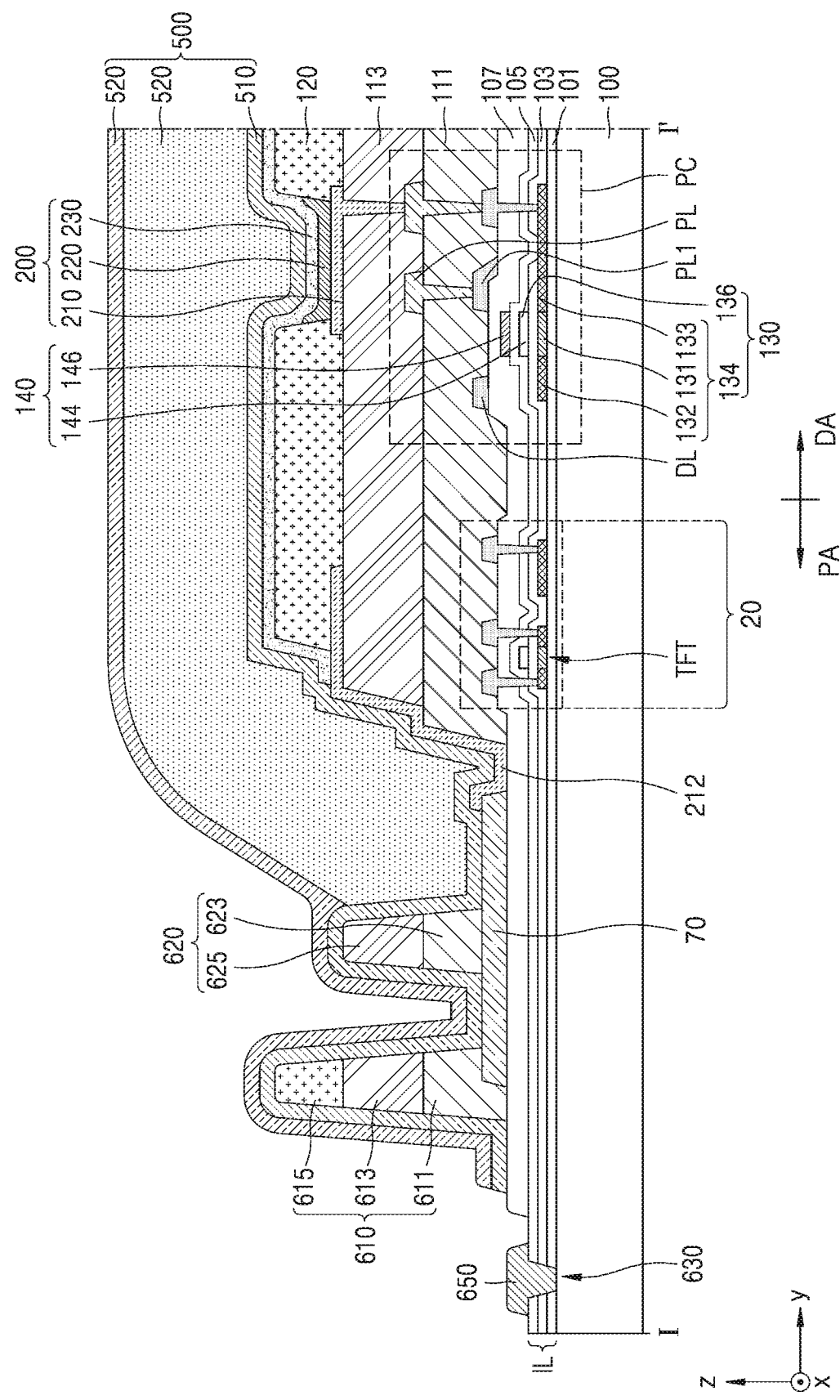
FIG. 3 is a schematic cross-sectional view of an example of a cross-section taken along line I-I' of FIG. 2.

FIG. 1 is a schematic plan view of a display device according to an embodiment of the present disclosure, FIG. 2 is an equivalent circuit diagram of a pixel of the display device according to an embodiment of the present disclosure, and FIG. 3 is a schematic cross-sectional view of an example of a cross-section taken along line I-I' of FIG. 1.

Referring to FIGS. 1, 2, and 3, a display device 10 according to an embodiment of the present disclosure has a display area DA in which an image is displayed and a peripheral area PA located around the display area DA. It can be understood that a substrate 100 includes the display area DA and the peripheral area PA.

A plurality of pixels P are located in the display area DA. FIG. 2 shows an example of an equivalent circuit diagram of one pixel P. Referring to FIG. 2, the pixel P may include a pixel circuit PC connected to a scan line SL and a data line DL, and a display element 200 connected to the pixel circuit PC. The display element 200 may be, for example, an organic light-emitting device (OLED).

The pixel circuit PC may include a driving thin-film transistor Td, a switching thin-film transistor Ts, and a storage capacitor Cst. The switching thin-film transistor Ts may be connected to the scan line SL and the data line DL, and may transmit a data signal input through the data line DL according to a scan signal input through the scan line SL to the driving thin-film transistor Td. The storage capacitor Cst may be connected to the switching thin-film transistor Ts and a driving voltage supply line PL, and may store a voltage corresponding to a difference between a voltage received from the switching thin-film transistor Ts and a driving voltage ELVDD supplied to the driving voltage supply line PL.

The driving thin-film transistor Td may be connected to the driving voltage supply line PL and the storage capacitor Cst, and may control a driving current flowing through the organic light-emitting device OLED from the driving voltage supply line PL in response to a voltage value stored in the storage capacitor Cst. The organic light-emitting device OLED may emit light having certain luminance according to the driving current. The organic light-emitting device OLED may emit, for example, red, green, blue, or white light.

Although FIG. 2 describes a case where the pixel P includes two thin-film transistors and one storage capacitor Cst, the present disclosure is not limited thereto. In another embodiment, the pixel circuit PC of the pixel P may vary, such as including three or more thin-film transistors or two or more storage capacitors.

The peripheral area PA may include a pad area PADA, which is an area to which various electronic devices or printed circuit boards are electrically attached, and a first voltage line 70 and a second voltage line 80 supplying power for driving the display element 200 may be located. The first voltage line 70 may be a common voltage (ELVSS) line, and the second voltage line 80 may be a driving voltage (ELVDD) line. The first voltage line 70 may be connected to a common electrode 230 directly or through another wire, and the second voltage line 80 may be connected to the driving voltage supply line PL.

The second voltage line 80 may be disposed between one side of the display area DA and the pad area PADA, and the first voltage line 70 may entirely surround the display area DA. The first voltage line 70 and the second voltage line 80 may be arranged to overlap each other at least partially between one side of the display area DA and the pad area PADA, and the first voltage line 70 and the second voltage line 80 may be arranged on different layers to prevent a short circuit between the first voltage line 70 and the second voltage line 80. That is, the first voltage line 70 and the second voltage line 80 have different distances from the substrate 100. When forming various conductive layers in the display area DA, the first voltage line 70 and the second voltage line 80 may be simultaneously formed of the same material. For example, the second voltage line 80 may have the same structure as a source electrode and a drain electrode of a thin-film transistor TFT, and the first voltage line 70 may have the same structure as wires arranged on a first insulating layer 111 covering the thin-film transistor TFT. However, the present disclosure is not limited thereto. When the first voltage line 70 and the second voltage line 80 are at different heights, the first voltage line 70 and the second voltage line 80 may have the same structure as various conductive layers in the display area DA.

Meanwhile, FIG. 1 may be understood as a plan view showing a state of the substrate 100 and the like during a manufacturing process of the display device 10. In the final display device 10 or an electronic device such as a smartphone including the display device 10, a portion of the substrate 100 may be bent in order to minimize the area of the peripheral area PA recognized by a user. For example, the substrate 100 may be bent between the pad area PADA and the display area DA, so that at least a portion of the pad area PADA overlaps the display area DA. However, a bending direction is set such that the pad area PADA does not cover the display area DA but is located behind the display area DA. Accordingly, the user recognizes that the display area DA occupies most of the display device 10.

Hereinafter, the structure of the pixel P will be described in more detail with reference to FIG. 3. The pixel circuit PC of the pixel P and the display element 200 are located on the substrate 100.

The substrate 100 may be formed of various materials such as a glass material, a metal material, or a plastic material such as polyethylene terephthalate (PET), polyethylene naphthalate (PEN), and polyimide.

A buffer layer 101 may be formed on the substrate 100. The buffer layer 101 may block permeation of foreign substances or moisture through the substrate 100. For example, the buffer layer 101 may include an inorganic material such as silicon oxide (SiOx), silicon nitride (SiNx), or/and silicon oxynitride (SiON), and may be a single layer or multiple layers. The buffer layer 101 may be formed to correspond to the display area DA and the peripheral area PA.

A thin-film transistor 130, a storage capacitor 140, and the display element 200 electrically connected thereto may be located in the display area DA on the substrate 100. For example, the display element 200 may be the organic light-emitting device OLED. Also, the thin-film transistor 130 of FIG. 3 may correspond to the driving thin-film transistor Td (of FIG. 2) provided in the pixel circuit PC, and the storage capacitor 140 corresponds to the storage capacitor Cst (of FIG. 2) described with reference to FIG. 2.

The thin-film transistor 130 includes a semiconductor layer 134 and a gate electrode 136. The semiconductor layer 134 may include, for example, polysilicon. The semiconductor layer 134 may include a channel area 131 overlapping the gate electrode 136, and a source area 132 and a drain area 133 arranged on both sides of the channel area 131 and doped with impurities having higher concentration than the channel area 131.

The impurities may include N-type impurities or P-type impurities. Source and drain electrodes of the thin-film transistor 130 may be connected to the source area 132 and the drain area 133, respectively. The source electrode and the drain electrode may be formed on the same layer as the data line DL. In another embodiment, the semiconductor layer 134 may include amorphous silicon or an organic semiconductor material. In another embodiment, the semiconductor layer 134 may include an oxide semiconductor.

Moreover, the pixel circuit PC may further include the switching thin-film transistor (Ts in FIG. 2) as described above with reference to FIG. 2. In addition, the semiconductor layer 134 of the thin-film transistor 130 and a semiconductor layer of the switching thin-film transistor Ts (of FIG. 2) may include different materials. For example, one of the semiconductor layer 134 of the thin-film transistor 130 and the semiconductor layer of the switching thin-film transistor Ts (of FIG. 2) may include an oxide semiconductor, and the other may include polysilicon.

A gate-insulating layer 103 may be disposed between the semiconductor layer 134 and the gate electrode 136. The gate-insulating layer 103 may be an inorganic insulating layer such as silicon oxynitride (SiON), silicon oxide (SiOx) and/or silicon nitride (SiNx), and the inorganic insulating layer may be a single layer or multiple layers. In addition, a lower electrode 144 of the storage capacitor 140 is disposed on the gate-insulating layer 103. As such, various conductive layers disposed on the gate-insulating layer 103 including the gate electrode 136 and the capacitor lower electrode 144 may be collectively referred to as a first gate wire.

The storage capacitor 140 includes the lower electrode 144 and an upper electrode 146 overlapping each other. A first interlayer insulating layer 105 may be disposed between the lower electrode 144 and the upper electrode 146.

The first interlayer insulating layer 105, which is a layer having a certain dielectric constant, may be an inorganic insulating layer such as silicon oxynitride (SiON), silicon oxide (SiOx) and/or silicon nitride (SiNx), and may be a single layer or multiple layers. On the first interlayer insulating layer 105, in addition to the capacitor upper electrode 146, various conductive layers such as connection wire, may be located. The various conductive layers disposed on the first interlayer insulating layer 105 may be collectively referred to as a second gate wire.

Meanwhile, in FIG. 3, the storage capacitor 140 overlaps the thin-film transistor 130, and the first lower electrode 144 is the gate electrode 136 of the thin-film transistor 130. However, the present disclosure is not limited thereto. In another embodiment, the storage capacitor 140 may not overlap the thin-film transistor 130, and the first lower electrode 144 may be an independent component separate from the gate electrode 136 of the thin-film transistor 130.

The storage capacitor 140 may be covered with a second interlayer insulating layer 107. The second interlayer insulating layer 107 may be an inorganic insulating layer such as silicon oxynitride (SiON), silicon oxide (SiOx), and/or silicon nitride (SiNx), and may be a single layer or multiple layers.

The data line DL and the source electrode and the drain electrode of the thin-film transistor 130 may be on the second interlayer insulating layer 107. As such, various conductive layers on the second interlayer insulating layer 107 may be collectively referred to as a first metal wire.

The driving voltage supply line PL may be disposed on the first insulating layer 111 covering the first metal wire.

The first insulating layer 111 may include an organic insulating material. The organic insulating material may include a general polymer such as polymethylmethacrylate (PMMA) or polystyrene (PS), a polymer derivative including a phenolic group, an acrylic polymer, an aryl ether polymer, an amide polymer, a fluorine-based polymer, a p-xylene-based polymer, a vinyl alcohol polymer, or a blend thereof. In an embodiment, the first insulating layer 111 may include polyimide.

The driving voltage supply line PL includes aluminum (Al), copper (Cu), titanium (Ti), and the like, and may be a single layer or multiple layers. In an embodiment, the driving voltage supply line PL may have a multilayer structure of Ti/Al/Ti. On the first insulating layer 111, in addition to the driving voltage supply line PL, various wires such as connection wire may be located. As such, various conductive layers disposed on the first insulating layer 111 may be collectively referred to as a second metal wire.

Meanwhile, FIG. 3 illustrates that a lower driving voltage line PL1 under the first insulating layer 111 is further included. The lower driving voltage line PL1 is electrically connected to the driving voltage supply line PL through a contact hole penetrating the first insulating layer 111 to prevent a voltage drop of the driving voltage ELVDD. The lower driving voltage line PL1 may include the same material as that of the data line DL. That is, the lower driving voltage line PL1 may be included in the first metal wire. For example, the lower driving voltage line PL1 and the data line DL include aluminum (Al), copper (Cu), titanium (Ti), and the like, and may be a single layer or multiple layers. In an embodiment, the lower driving voltage line PL1 and the data line DL may have a multilayer structure of Ti/Al/Ti or TiN/Al/Ti.

The driving voltage supply line PL is covered with a second insulating layer 113, and the second insulating layer 113 may include an imide-based polymer, a general-purpose polymer such as polymethyl methacrylate (PMMA) or polystyrene (PS), a polymer derivative including a phenolic group, an acrylic polymer, an aryl ether polymer, an amide polymer, a fluorine-based polymer, a p-xylene-based polymer, a vinyl alcohol polymer, and a blend thereof. In an embodiment, the second insulating layer 113 may include polyimide.

A pixel electrode 210 is disposed on the second insulating layer 113. A pixel-defining layer 120 is on the pixel electrode 210, and the pixel-defining layer 120 may define a light emitting area by having an opening corresponding to a pixel, that is, an opening through which at least a central portion of the pixel electrode 210 is exposed. In addition, the pixel-defining layer 120 may increase a distance between an edge of the pixel electrode 210 and the common electrode 230, thereby preventing generation of an arc or the like therebetween. The pixel-defining layer 120 may include an organic material such as polyimide or hexamethyldisiloxane (HMDSO).

An intermediate layer 220 may include a low molecular weight material or a polymer material. When the intermediate layer 220 includes a low molecular weight material, the intermediate layer 220 may have a single or composite structure by stacking a hole injection layer (HIL), a hole transport layer (HTL), an emission layer (EML), an electron transport layer (ETL), and an electron injection layer (EIL). The intermediate layer 220 may include various organic materials, such as copper phthalocyanine (CuPc), N,N'-Di (naphthalene-1-yl)-N,N'-diphenyl-benzidine (NPB), and tris-8-hydroxyquinoline aluminum (Alq3). The layers may be formed by a vapour deposition method.

When the intermediate layer 220 includes a polymer material, the intermediate layer 220 may have a structure including an HTL and an EML. The HTL may include PEDOT, and the EML may include a polymer material such as poly-phenylenevinylene (PPV) and polyfluorene. However, the intermediate layer 220 is not limited thereto, and may have various structures. For example, at least one of layers constituting the intermediate layer 220 may be integrally formed over a plurality of pixel electrodes 210. Alternatively, the intermediate layer 220 may include a layer patterned to correspond to each of the plurality of pixel electrodes 210.

The common electrode 230 may be arranged on the display area DA to cover the display area DA. That is, the common electrode 230 may be integrally formed with respect to the plurality of pixels P.

The peripheral area PA disposed on the substrate 100 may surround the display area DA. The peripheral area PA is an area in which the pixels P are not arranged and corresponds to a non-display area that does not provide an image. The peripheral area PA includes a pad area, which is an area to which various electronic devices or printed circuit boards are electrically attached, and a driving circuit unit 20 and the first voltage line 70 may be located.

The driving circuit unit 20 may transmit various control signals to the display area DA. The driving circuit unit 20 may include a light-emitting driving circuit, a scan driving circuit, and the like. The driving circuit unit 20 includes thin-film transistors TFTs, and may include wires (not shown) connected to the thin-film transistors TFTs. The thin-film transistor TFT included in the driving circuit unit 20 may be formed in the same process as that of the thin-film transistor 130 of the pixel circuit PC. Accordingly, the driving circuit unit 20 includes insulating layers IL between elements (e.g., a semiconductor layer, gate electrode, source and drain electrodes, etc.) constituting the thin-film transistor TFT. For example, the gate-insulating layer 103, the first interlayer insulating layer 105, and the second interlayer insulating layer 107 may extend to the peripheral area PA to form the insulating layers IL.

The first voltage line 70 includes the same material as that of the second metal wire arranged on the first insulating layer 111 in the display area DA, and may be on the second interlayer insulating layer 107 in the peripheral area PA. For example, the first voltage line 70 may include the same material as that of the driving voltage supply line PL.

An inner edge of the first voltage line 70 may be covered by a conductive layer 212. The conductive layer 212 has the same configuration as that of the pixel electrode 210 and may be connected to the common electrode 230. In another embodiment, the inner edge of the first voltage line 70 may extend toward the display area DA to directly contact the common electrode 230.

Meanwhile, as described above, because the common electrode 230 is integrally formed with a plurality of display elements 200, a potential difference may occur between edges of the common electrode and the center of the common electrode due to a resistance of the common electrode 230. Accordingly, when a common voltage ELVSS is supplied through some edges of the common electrode as in the prior art, a difference occurs in the magnitude of the common voltage ELVSS supplied to one display element 200 arranged in the center of the common electrode and another display element 200 arranged at the edge of the common electrode connected to the first voltage line 70, and thus, a luminance imbalance may appear between the display elements 200. This phenomenon may increase as the area of the display area DA increases.

However, according to the present disclosure, because the first voltage line 70 entirely surrounds the display area DA and all edges of the common electrode 230 are connected to the first voltage line 70, the common voltage ELVSS may be supplied to the common electrode 230 through all edges of the common electrode 230. Therefore, the potential of the common electrode 230 may be uniform throughout the common electrode 230, and accordingly, the luminance imbalance between the display elements 200 is prevented or reduced, and accordingly, the display device 10 may display a high-quality image.

Meanwhile, the driving circuit unit 20 arranged adjacent to the first voltage line 70 may not include components located on the same layer as the driving voltage supply line PL. For example, a light-emitting driving circuit, a scan driving circuit, and the like included in the driving circuit unit 20 may not include a wire included in the second metal wire arranged on the first insulating layer 111. Therefore, as the first voltage line 70 includes the same material as that of the driving voltage supply line PL on the first insulating layer 111 and is formed at the same time as the driving voltage supply line PL, a risk of a short circuit with other wires included in the driving circuit unit 20 disposed between the first voltage line 70 and the pixel circuit PC may be effectively prevented.

An encapsulation layer 500 protecting the display element 200 from external moisture or oxygen may be on the common electrode 230. The encapsulation layer 500 has a shape extending to not only the display area DA where the display element 200 is located, but also the peripheral area PA disposed outside the display area DA. The encapsulation layer 500 may have a multilayer structure. For example, as illustrated in FIG. 3, the encapsulation layer 500 may include a first inorganic encapsulation layer 510, an organic encapsulation layer 520, and a second inorganic encapsulation layer 530.

The first inorganic encapsulation layer 510 covers the common electrode 230 and may include silicon oxide, silicon nitride, and/or silicon oxynitride. The shape of the first inorganic encapsulation layer 510 is formed in accordance to the shape of a structure therebelow, and thus, as shown in FIG. 3, an upper surface thereof is not flat.

The organic encapsulation layer 520 covers the first inorganic encapsulation layer 510 and has a sufficient thickness, and an upper surface of the organic encapsulation layer 520 may be substantially flat over the entire display area DA. The organic encapsulation layer 520 may include polyethylene terephthalate, polyethylene naphthalate, polycarbonate, polyimide, polyethylene sulfonate, polyoxymethylene, polyarylate, hexamethyldisiloxane, an acrylic resin (e.g., polymethyl methacrylate, a polyacrylic acid, etc.), or any combination thereof.

The second inorganic encapsulation layer 530 covers the organic encapsulation layer 520 and may include silicon oxide, silicon nitride, and/or silicon oxynitride. The second inorganic encapsulation layer 530 extends outside the organic encapsulation layer 520 to contact the first inorganic encapsulation layer 510, so that the organic encapsulation layer 520 is not exposed to the outside.

In this manner, because the encapsulation layer 500 has a multilayer structure including the first inorganic encapsulation layer 510, the organic encapsulation layer 520, and the second inorganic encapsulation layer 530, even if the encapsulation layer 500 cracks, the cracks may not be connected to each other between the first inorganic encapsulation layer 510 and the organic encapsulation layer 520, or between the organic encapsulation layer 520 and the second inorganic encapsulation layer 530. In this manner, the formation of a penetration path of external moisture or oxygen into the display area DA may be prevented or minimized.

Meanwhile, when forming the encapsulation layer 500, in more detail, when forming the organic encapsulation layer 520, it is necessary to limit the material for forming the organic encapsulation layer 520 to be within a preset area. To this end, as shown in FIG. 3, a first partition 610 may be in the peripheral area PA. In more detail, as illustrated in FIG. 3, the first insulating layer 111 may be in the peripheral area PA as well as the display area DA of the substrate 100, and the first partition 610 is located apart from the first insulating layer 111 in the peripheral area PA.

The first partition 610 may have a multilayer structure. For example, the first partition 610 may include a first layer 611, a second layer 613, and a third layer 615 in a direction away from a portion close to the substrate 100. The first layer 611 may be formed of the same material and at the same time as the first insulating layer 111, and the second layer 613 may be formed of the same material and at the same time as the second insulating layer. The third layer 615 may be additionally formed on the second layer 613 with the same material as the second layer 613, or may be simultaneously formed of the same material as the pixel-defining layer 120 when the pixel-defining layer 120 is formed.

Also, as illustrated in FIG. 3, in addition to the first partition 610, a second partition 620 may also be between the first partition 610 and an end of the first insulating layer 111. The second partition 620 may be on the first voltage line 70. The second partition 620 is also apart from the first insulating layer 111 in the peripheral area PA (of FIG. 1). The second partition 620 may also have a multilayer structure, like the first partition 610, and may include a smaller number of layers than the first partition 610 so that the height from the substrate 100 is lower than that of the first partition 610. FIG. 3 illustrates an example where a lower layer 623 of the second partition 620 may be formed of the same material and at the same time as the second layer 613 of the first partition 610 and an upper layer 625 located on the lower layer 623 may be formed of the same material and at the same time as the third layer 615 of the first partition 610.

Accordingly, the position of the organic encapsulation layer 520 is first defined by the second partition 620, so that the material for forming the organic encapsulation layer 520 is prevented from overflowing to the outside of the second partition 620 in the process of forming the organic encapsulation layer 520. Even if the material for forming the organic encapsulation layer 520 partially overflows outside the second partition 620, the position is limited by the first partition 610 so that the material for forming the organic encapsulation layer 520 may no longer move toward an edge of the substrate 100. In contrast, the first inorganic encapsulation layer 510 and the second inorganic encapsulation layer 530 are formed to the outside of the first partition 610 by covering the second partition 620 and the first partition 610 as shown in FIG. 3.

Meanwhile, a crack prevention portion 630 may be located outside the first partition 610. The crack prevention portion 630 may extend along the z-direction to expose at least atop portion of the substrate 100. For example, the crack prevention portion 630 may have a shape that surrounds the display area DA. In addition, in some sections, the crack prevention portion 630 may have a discontinuous shape. The crack prevention portion 630 may prevent cracks that may occur in the insulating layers IL of inorganic materials due to impact or the like when cutting a mother substrate during the manufacturing process of the display device 10 or when the display device 10 is used, from being transmitted to the display area DA. Here, the insulating layers IL may be understood as including the buffer layer 101, the gate-insulating layer 103, and the first interlayer insulating layer 105 stacked on the substrate 100. In some cases, the insulating layers IL may include the second interlayer insulating layer 107.

The crack prevention portion 630 may have a groove shape in which some of the insulating layers IL are removed. In addition, the crack prevention portion 630 may be covered with a cover layer 650 as shown in FIG. 3. For example, when forming the first insulating layer 111 or the second insulating layer 113 in the display area DA, the cover layer 650 may be formed of the same material and at the same time as the first insulating layer 111 or the second insulating layer 113. The first inorganic encapsulation layer 510 and the second inorganic encapsulation layer 530 of the encapsulation layer 500 extends along the y-direction, but do not extend to the crack prevention portion 630. That is, the crack prevention portion 630 is not covered by the first inorganic encapsulation layer 510 and the second inorganic encapsulation layer 530, and both ends of the first inorganic encapsulation layer 510 and the second inorganic encapsulation layer 530 may be spaced apart from the crack prevention portion 630.

Figure 4:
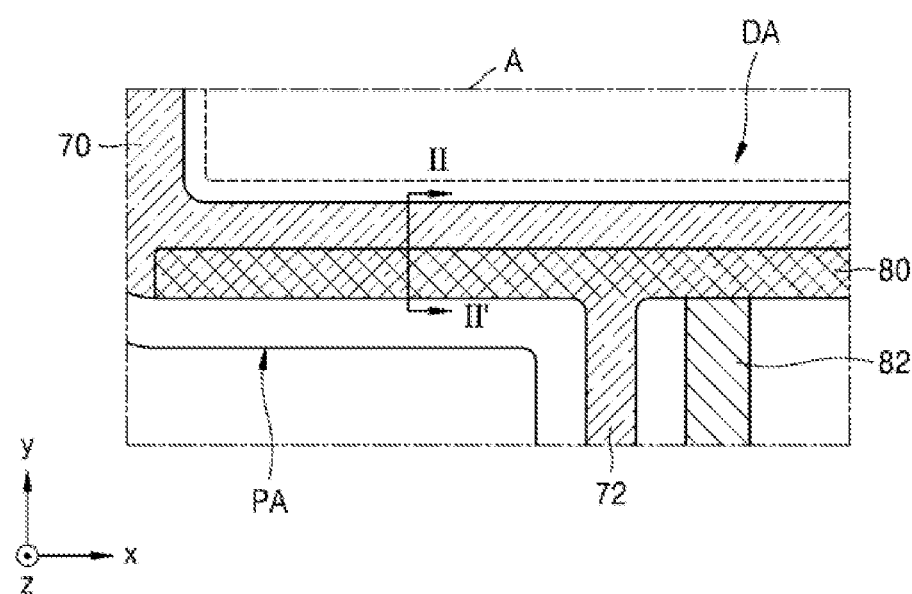
FIG. 4 is an enlarged schematic plan view of region A of FIG. 1.
Figure 5:
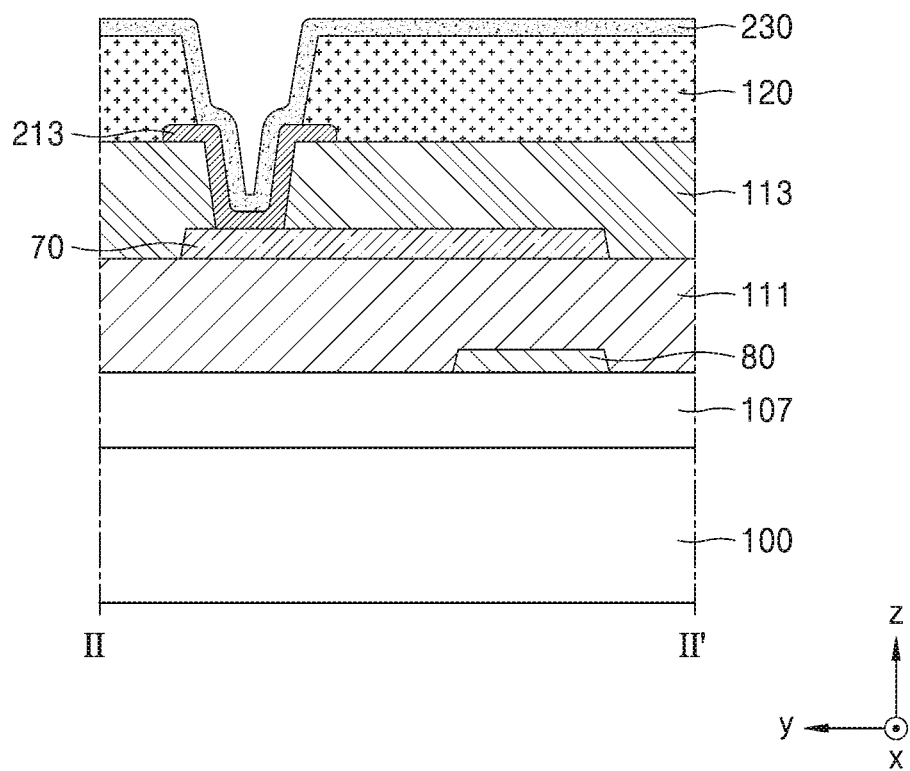
FIG. 5 is a schematic cross-sectional view of an example of a cross-section taken along line II-II' of FIG. 4.

FIG. 4 is an enlarged schematic plan view of region A of FIG. 1, and FIG. 5 is a schematic cross-sectional view of an example of a cross-section taken along line II-II' of FIG. 4. Hereinafter, description will be made with reference to FIGS. 1, 4, and 5 together.

Referring to FIGS. 1, 4, and 5, the second voltage line 80 may be disposed between one side of the display area DA and the pad area PADA, and the first voltage line 70 may entirely surround the display area DA. The first voltage line 70 and the second voltage line 80 may include connection portions 72 and 82 extending toward the pad area PADA.

The common electrode 230 may be connected to the first voltage line 70 between the one side of the display area DA and the pad area PADA. For example, the common electrode 230 may be connected to the first voltage line 70 through a second conductive layer 213 arranged on the second insulating layer 113. The second conductive layer 213 may include the same material as that of the pixel electrode 210 of FIG. 3. However, the present disclosure is not limited thereto, and the common electrode 230 may be directly connected to the first voltage line 70 through a contact hole formed in the second insulating layer 113 and the pixel-defining layer 120.

In this way, as the common electrode 230 and the first voltage line 70 are connected to each other between the one side of the display area DA and the pad area PADA, all edges of the common electrode 230 may be connected to the first voltage line 70. Therefore, because the common voltage ELVSS may be supplied to the common electrode 230 through all edges of the common electrode 230, the potential of the common electrode 230 may be more uniform throughout the common electrode 230, and accordingly, the luminance imbalance between the display elements 200 is prevented or reduced, and accordingly, the display device 10 may display a high-quality image.

Meanwhile, the first voltage line 70 and the second voltage line 80 may be arranged on different layers. That is, the first voltage line 70 and the second voltage line 80 may have different distances from the substrate 100. For example, as illustrated in FIG. 5, the first voltage line 70 may include the same material as that of the second metal wire arranged on the first insulating layer 111 in the display area DA, and the second voltage line 80 may include the same material as that of the first metal wire arranged on the second interlayer insulating layer 107 in the display area DA.

In this way, as the first voltage line 70 and the second voltage line 80 are arranged on different layers, at least a portion of the first voltage line 70 may overlap the second voltage line 80 in a vertical direction. Therefore, compared to a case where the first voltage line 70 and the second voltage line 80 are arranged on the same layer, an area for arranging the first voltage line 70 and the second voltage line 80 may be reduced, and thus, the display area DA may be increased. Meanwhile, in FIGS. 4 and 5, a width of the first voltage line 70 is greater than a width of the second voltage line 80, and the first voltage line 70 is closer to the display area DA than the second voltage line 80. However, the present disclosure is not limited thereto. That is, the second voltage line 80 may be closer to the display area DA than the first voltage line 70, and the width of the second voltage line 80 may be greater than or equal to the width of the first voltage line 70.

Figure 6:
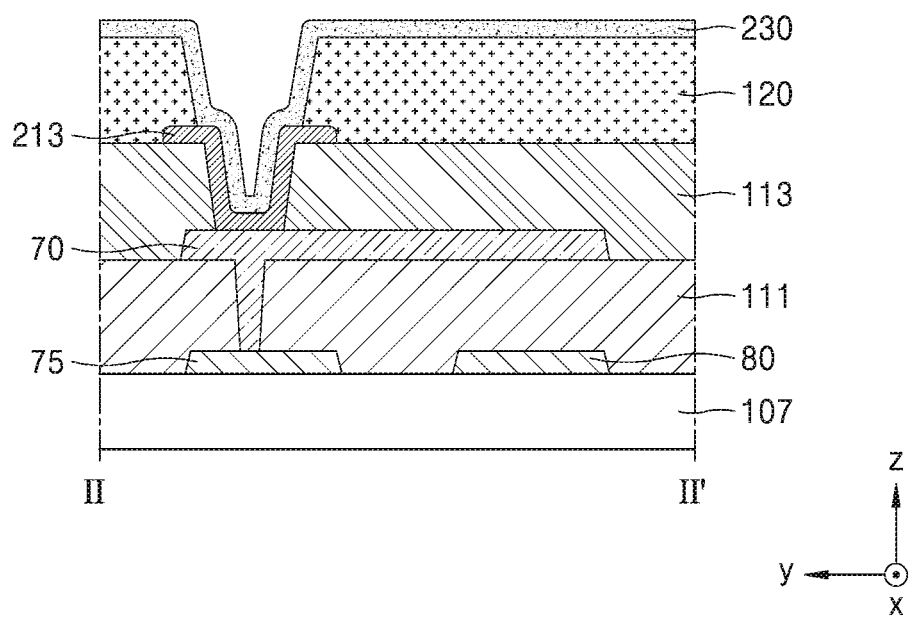
FIG. 6 is a schematic cross-sectional view of another example of the cross-section taken along line II-II' of FIG. 4.
Figure 7:
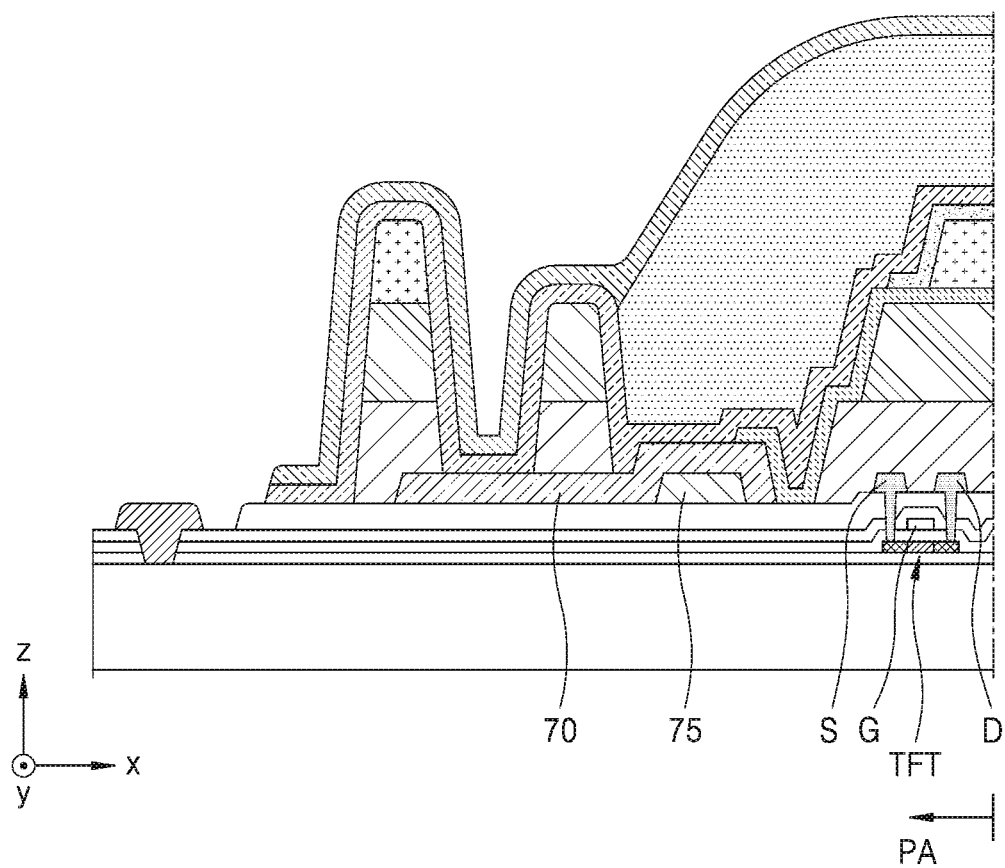
FIG. 7 is a schematic cross-sectional view of a portion of FIG. 3.

FIG. 6 is a schematic cross-sectional view of another example of the cross-section taken along line II-II' of FIG. 4, and FIG. 7 is a schematic cross-sectional view of a portion of FIG. 3. FIG. 7 mainly shows the peripheral area PA in the cross-section of line II-II' of FIG. 1. Hereinafter, description will be made with reference to FIGS. 1, 6, and 7 together, but detailed descriptions of the same parts as described above will not be given herein.

Referring to FIGS. 1, 6, and 7, the first voltage line 70 and the second voltage line 80 may be arranged on different layers. For example, as illustrated in FIG. 6, the first voltage line 70 may include the same material as that of the second metal wire arranged on the first insulating layer 111 in the display area DA, and the second voltage line 80 may include the same material as that of the first metal wire arranged on the second interlayer insulating layer 107 in the display area DA.

Furthermore, the first voltage line 70 may be connected to the common electrode 230 through the second conductive layer 213 arranged on the second insulating layer 113. In another example, the common electrode 230 may be directly connected to the first voltage line 70 without the second conductive layer 213 through a contact hole formed in the second insulating layer 113 and the pixel-defining layer 120.

The first voltage line 70 may be connected to an auxiliary wire 75 under the first voltage line 70. The auxiliary wire 75 is arranged on a layer different from the first voltage line 70 in order to reduce the resistance of the first voltage line 70. The auxiliary wire 75 may be arranged only in a partial area of the first voltage line 70 or may be arranged over the entire first voltage line 70.

For example, the auxiliary wire 75 may be disposed between one side of the display area DA and the pad area PADA. In addition, the auxiliary wire 75 may be disposed on the same layer as the second voltage line 80 and may have the same structure as the second voltage line 80. In this case, the auxiliary wire 75 and the second voltage line 80 may be spaced apart from each other along the y-direction to prevent a short circuit.

When the auxiliary wire 75 is arranged entirely along the first voltage line 70, as shown in FIG. 7, the first voltage line 70 may be electrically connected to the auxiliary wire 75 therebelow at the remaining edge except for one side of the display area DA adjacent to the pad area PADA. Here, the electrical connection includes both the case where the auxiliary wire 75 is in direct contact with the first voltage line 70 or an insulating layer is between the auxiliary wire 75 and the first voltage line 70 and the case where the auxiliary wire 75 is connected to the first voltage line 70 through a contact hole. Accordingly, the resistance of the first voltage line 70 may be reduced, and a voltage drop of the common voltage ELVSS (see FIG. 2) applied to the common electrode 230 may be prevented. In addition, because the width of the first voltage line 70 may be reduced, a dead area of the display device 10 (of FIG. 1) may be reduced.

Meanwhile, FIGS. 6 and 7 illustrate an example in which the auxiliary wire 75 includes the same material as a source electrode S and a drain electrode D of the thin-film transistor TFT, and is located on the same layer as these layers, but the present disclosure is not limited thereto. In other words, the auxiliary wire 75 may have the same material as a gate electrode G of the thin-film transistor TFT, that is, the same structure as the first gate wire in the display area DA. In addition, it is understood that the auxiliary wire 75 may have the same structure as the second gate wire in the display area DA.

Figure 8:
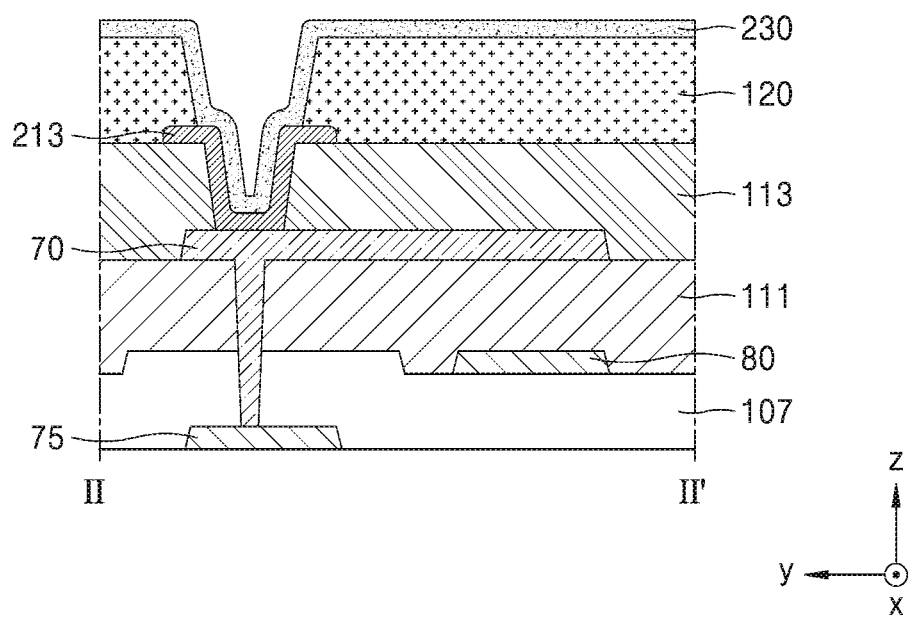
FIG. 8 is a schematic cross-sectional view of another example of the cross-section taken along line II-II' of FIG. 4.
Figure 9:
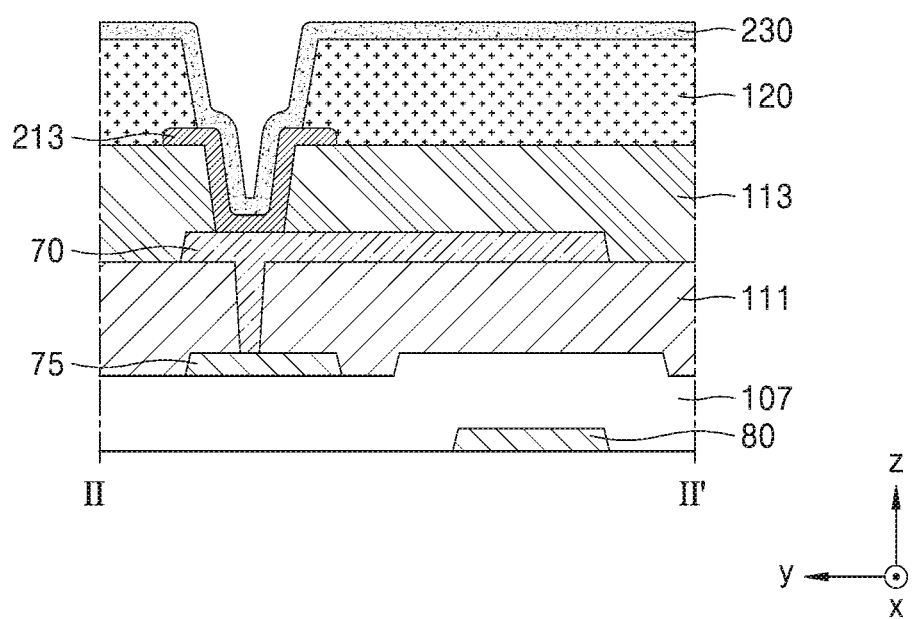
FIG. 9 is a schematic cross-sectional view of another example of the cross-section taken along line II-II' of FIG. 4.

FIGS. 8 and 9 are cross-sectional views each illustrating another example of the cross-section II-II' of FIG. 4. Hereinafter, in the description of FIGS. 8 and 9, reference will be made to FIG. 1.

As illustrated in FIGS. 8 and 9, respectively, the first voltage line 70 and the second voltage line 80 may be disposed on different layers as described above, and the common electrode 230 may be connected to the first voltage line 70 through the second conductive layer 213 through a contact hole defined in the second insulating layer 113, or may be directly connected to the first voltage line 70 without the second conductive layer 213 through a contact hole formed in the second insulating layer 113 and the pixel-defining layer 120. In addition, because the first voltage line 70 is connected to the auxiliary wire 75, the resistance may be reduced.

A difference among FIGS. 6, 8, and 9 is whether the auxiliary wire 75 and the second voltage line 80 are on different layers. That is, in FIG. 6, the auxiliary wire 75 and the second voltage line 80 are disposed on the same layer. Unlikely, in FIGS. 8 and 9, the auxiliary wire 75 and the second voltage line 80 are disposed on different layers. In particular, in FIG. 8, the second voltage line 80 is disposed on the second interlayer insulating layer 107, and the auxiliary wire 75 is disposed on the substrate 100. More particularly, in FIG. 9, the second voltage line 80 is disposed on the substrate 100, and the auxiliary wire 75 is disposed on the second interlayer insulating layer 107. FIG. 8 shows an example in which the second voltage line 80 includes the same material as the first metal wire arranged on the second interlayer insulating layer 107, and the auxiliary wire 75 includes the second gate wire on the insulating layers IL. Furthermore, FIG. 9 illustrates an example in which the second voltage line 80 includes the same material as the second gate line and the auxiliary line 75 includes the same material as the first metal line, contrary to FIG. 8. In this way, when the auxiliary wire 75 and the second voltage line 80 are on different layers, a risk of a short circuit between the auxiliary wire 75 and the second voltage line 80 may be reduced or prevented.

Although FIGS. 8 and 9 illustrate that the auxiliary wire 75 and the second voltage line 80 each have the same structure as the second gate wire, the present disclosure is not limited thereto. That is, the auxiliary wire 75 or the second voltage line 80 may have the same structure as the first gate wire, or may have the same structure as an additional wire on the second metal wire.

As described above, the present disclosure has been described with reference to an embodiment shown in the drawings, but this is only an example, and those of ordinary skill in the art will understand that various modifications and variations of the embodiment are possible therefrom. Therefore, the true technical protection scope of the present disclosure should be determined by the technical spirit of the appended claims.

The invention claimed is:

1. A display device comprising:
a substrate including a display area and a peripheral area around the display area;
a thin-film transistor disposed on the substrate in the display area and a display element electrically connected to the thin-film transistor; and
a first voltage line and a second voltage line located on the substrate in the peripheral area and supplying power to drive the display element,
wherein the first voltage line is a common voltage line and entirely surrounds the display area,
the second voltage line is a driving voltage line and is disposed to correspond to one side of the display area, and
the first voltage line and the second voltage line are disposed on different layers, and
wherein the first voltage line at least partially overlaps with at least one partition disposed in the peripheral area.

2. The display device of claim 1, wherein the display element includes a pixel electrode electrically connected to the thin-film transistor, a common electrode on the pixel electrode, and an intermediate layer including an organic material between the pixel electrode and the common electrode, and
all edges of the common electrode are electrically connected to the first voltage line.

3. The display device of claim 2, wherein the common electrode and the first voltage line are connected to each other through a conductive layer, and
the conductive layer has a same configuration as the pixel electrode.

4. The display device of claim 1, wherein the substrate further includes a pad area located in the peripheral area,
the second voltage line is disposed between one side of the display area and the pad area, and
the first voltage line at least partially overlaps the second voltage line in a vertical direction.

5. The display device of claim 1, further comprising a first insulating layer covering the thin-film transistor disposed between the thin-film transistor and the display element,
wherein the first voltage line has a same structure as a metal wire disposed on the first insulating layer, and the second voltage line has a same structure as a source electrode and a drain electrode of the thin-film transistor.

6. The display device of claim 5, further comprising a driving circuit unit located on the substrate in the peripheral area and transmitting an electric signal to the display area,
wherein the driving circuit unit is covered by the first insulating layer.

7. A display device comprising:
a substrate including a display area and a peripheral area around the display area;
a thin-film transistor disposed on the substrate in the display area and a display element electrically connected to the thin-film transistor;
a first voltage line and a second voltage line located on the substrate in the peripheral area and supplying power to drive the display element, and
an auxiliary wire arranged under the first voltage line and electrically connected to the first voltage line,
wherein the first voltage line is a common voltage line and entirely surrounds the display area,
the second voltage line is a driving voltage line and is disposed to correspond to one side of the display area, and
the first voltage line and the second voltage line are disposed on different layers.

8. The display device of claim 7, wherein the auxiliary wire is disposed on a same layer as the second voltage line and has a same structure as the second voltage line.

9. The display device of claim 7, wherein the auxiliary wire and the second voltage line are disposed on the different layers.

10. The display device of claim 7, wherein the first voltage line entirely overlaps the auxiliary wire.

11. A display device comprising:
a substrate including a display area and a peripheral area around the display area;
a pixel circuit located on the substrate in the display area and an organic light-emitting device electrically connected to the pixel circuit;
a first voltage line located on the substrate in the peripheral area and applying a common voltage to the organic light-emitting device; and
a driving circuit unit located on the substrate in the peripheral area and disposed between the first voltage line and the pixel circuit, and transmitting an electric signal to the display area,
wherein the driving circuit unit is covered by a first insulating layer disposed over the display area and the peripheral area, and
the first voltage line entirely surrounds the display area and has equal material and structure as a wire on the first insulating layer of the display area.

12. The display device of claim 11, wherein the organic light-emitting device includes a common electrode electrically connected to the first voltage line, and
all edges of the common electrode are electrically connected to the first voltage line.

13. The display device of claim 11, wherein the substrate further comprises a pad area located in the peripheral area, and a second voltage line disposed between one side of the display area and the pad area, and
the second voltage line is disposed at a different height from the first voltage line.

14. The display device of claim 13, wherein the first insulating layer is disposed between the second voltage line and the first voltage line.

15. The display device of claim 13, wherein the first voltage line at least partially overlaps the second voltage line in a vertical direction.

16. The display device of claim 13, further comprising an auxiliary wire disposed under the first voltage line and electrically connected to the first voltage line.

17. The display device of claim 16, wherein the auxiliary wire is disposed on a same layer as the second voltage line, and has a same structure as the second voltage line.

18. The display device of claim 16, wherein the first voltage line and the second voltage line are disposed on different layers.

19. The display device of claim 11, further comprising a first inorganic encapsulation layer, an organic encapsulation layer, and a second inorganic encapsulation layer sequentially stacked on the organic light-emitting device,
wherein the first inorganic encapsulation layer and the second inorganic encapsulation layer contact each other outside the organic encapsulation layer.

20. The display device of claim 19, further comprising a first partition located on the substrate in the peripheral area and spaced apart from the first insulating layer,
wherein the first inorganic encapsulation layer and the second inorganic encapsulation layer extend to the outside of the first partition.

* * * * *